United States Patent

Lockhart, Jr. et al.

[11] 4,309,657
[45] Jan. 5, 1982

[54] APPARATUS FOR ANALYZING SEMICONDUCTOR MEMORIES

[75] Inventors: James A. Lockhart, Jr., Basking Ridge; Shung-huei Chang, Highland Park, both of N.J.

[73] Assignee: Burroughs Corporation, Detroit, Mich.

[21] Appl. No.: 110,707

[22] Filed: Jan. 9, 1980

[51] Int. Cl.³ .................. G01R 31/22; G01R 31/02
[52] U.S. Cl. .................. 324/158 R; 324/51; 324/73 R
[58] Field of Search ............ 324/158 R, 158 P, 158 F, 324/158 D, 73 R, 73 PC, 51

[56] References Cited

U.S. PATENT DOCUMENTS 3,549,999 12/1970 Norton ............................ 324/73 R
4,051,437 9/1977 Lile et al. ....................... 324/158 D

*Primary Examiner*—Ernest F. Karlsen
*Attorney, Agent, or Firm*—Kevin R. Peterson; Robert A. Green; David G. Rasmussen

[57] ABSTRACT

The disclosure is of apparatus for generating raster scans on an oscilloscope combined with an electron microscope used for scanning and examining semiconductor devices. A scanning electron microscope can be operated to generate artificial or induced faults in semiconductor memories, and the raster scanner, in carrying out a scan, will visually display on the oscilloscope natural and artificial or induced faulty locations or cells in semiconductor memories. The semiconductor memory under test is positioned at different locations in the microscope, at each of which an artificial fault is generated until a position is reached, at which the artificial fault coincides, or nearly coincides, with the natural fault location as displayed by the raster scanner. When this is achieved, the electron microscope can then be used to examine the naturally faulty location or cell to determine the reason for the fault.

1 Claim, 2 Drawing Figures

APPARATUS FOR ANALYZING SEMICONDUCTOR MEMORIES

BACKGROUND OF THE INVENTION

It is well known that a scanning electron microscope (SEM) can be used as a tool for studying and determining the cause for failure in an integrated circuit semiconductor device. However, in the present state of the art, it is almost impossible to find, visually, in a scanning electron microscope, the exact location of a defect in an integrated circuit or memory which typically has thousands of circuits and thousands of transistors or memory cells, or the like. The defect could be caused by a very small physical anomaly associated with one transistor or one circuit line. It may be on a top layer or a buried layer. The search for such a defect visually in a SEM can be very time consuming and sometimes practically impossible using presently known techniques.

DESCRIPTION OF THE PREFERRED EMBODIMENTS

Figure 1:
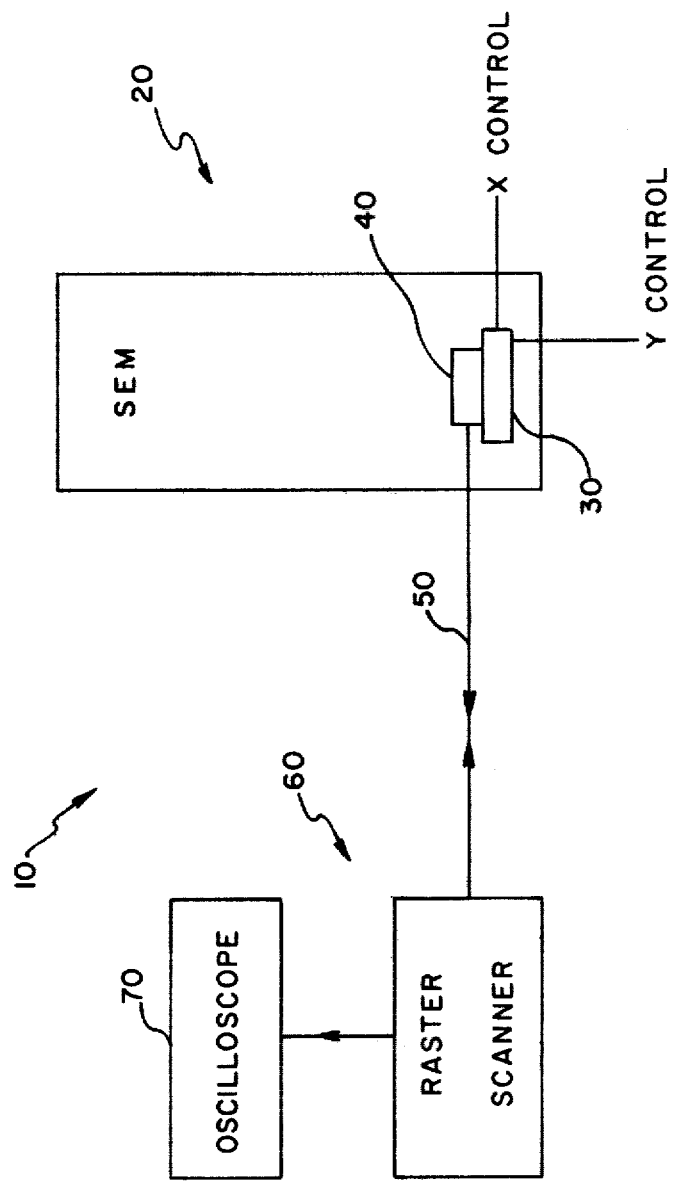
FIG. 1 is a schematic representation of a system embodying the invention.

The system of the invention 10 is illustrated in FIG. 1 and includes a conventional scanning electron microscope 20 having a specimen support table 30 which can be moved in X and Y directions by means of suitable controls, whereby different portions of a specimen 40 on the support table can be placed in viewing position. In the present invention, a semiconductor device, such as an integrated circuit memory on a suitable socket, is the specimen 40 and is placed on the table 30. Row and column address lines 50, which contain coded information for every row and column of cells or semiconductor elements in the memory, extend from the SEM 20 to a raster scan tester (RST) 60. The RST 60 is adapted to scan or address the rows and columns of the memory 40, and the RST includes an oscilloscope 70 for displaying the condition of the cells of the scanned or addressed memory.

Any suitable apparatus for continuously scanning or addressing all cells in a matrix can be used for the raster scan tester 60 in practicing the invention. A particularly desirable scanning system is described and claimed in a copending application of Lockhart, Ser. No. 75,588, filed Sept. 14, 1979, entitled LOGIC SIGNALS CONTROL SYSTEM, now U.S. Pat. No. 4,249,173 in which a system is described for scanning matrices of various capacities and for scanning semiconductor memories, or the like, to locate faulty cells therein. This application is incorporated herein by reference. The application describes a system which can be used to scan 4K, 16K, 64K or 256K matrices or memories.

Figure 2:
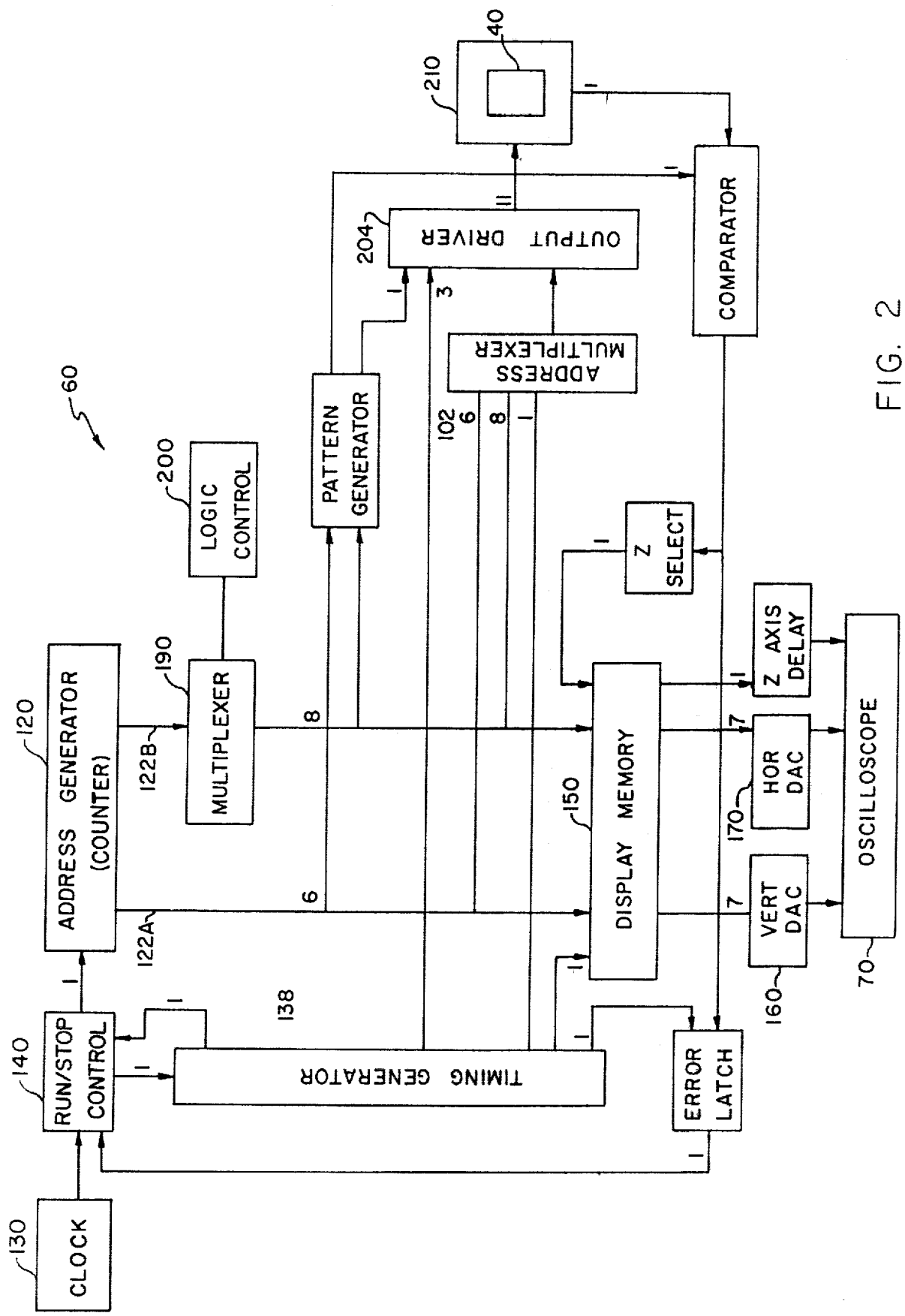
FIG. 2 is a schematic representation of an electronic raster scan apparatus which may be used in the system of FIG. 1.

Referring to the block diagram of the Lockhart system which is shown in FIG. 2, the system includes an address generator or counter 120 having a plurality of output lines 122 and a clock 130 coupled through a control circuit 140 to the input of the generator 120 to operate the generator and provide a sequence of logic signals on the output lines 122. The output lines 122 are coupled through a display memory or buffer 150 to horizontal and vertical digital-to-analog converters 160 and 170 and then to the oscilloscope 70. One group of output lines 122A is coupled directly to the display memory 150, and the remainder 122B are coupled through a multiplexer 190 to the display memory 150. A logic control circuit 200 is coupled to multiplexer 190 and is used to set the multiplexer so that the signals at the display memory 150 can scan either a 4K, 16K, 64K or 256K matrix on the oscilloscope 70.

The output lines 122 from the address generator or counter 120 and multiplexer 190 are also coupled through various circuit modules, including an address multiplexer 202 and drivers 204, to a test head 210 which carries a memory module 40, of any of the sizes noted above, to be scanned and tested.

In operation of the scanner of FIG. 2, the logic control circuit 200 is set to cause the desired matrix to be scanned and displayed on the oscilloscope 70. If the selected matrix is a 4K matrix which has 64 rows and 64 columns, then, as the address generator is cycled by the clock 130, logic signals which appear on lines 122 cause the electron beam in the oscilloscope 70 to be positioned at the first column of the matrix and to be moved through 64 rows in the first column of the matrix and then to the second column of the matrix in which it is moved through the 64 rows, and then the beam is scanned through the other rows of the matrix associated with the remainder of the 64 columns. As the row and column positions of the matrix are thus scanned, the corresponding positions in the memory 40 under test are also scanned.

In operation of the invention, as the scanner 60 is operated and the memory 40 is scanned, all cells are charged and defective cells therein are detected and displayed on the oscilloscope 70. In order to locate a defective cell so that it can be examined visually in the microscope 20, the electron beam in the microscope is randomly aimed at the memory 40, and it is operated to produce an artificial fault therein which is also detected and displayed by the logic scanner. The fault is produced by the electron beam of the SEM which produces electron-hole pairs in the silicon. The electron-hole pairs provide charge carriers that alter the capacitively stored charge in a memory cell. This induced fault can be seen on the RST oscilloscope 70 as an error dot.

After the inherent fault and the induced fault are seen on the oscilloscope, the memory 40 under test is then moved by the X and Y controls to bring the two faults closer together, and, at a second position, another artificial fault is induced by the electron beam of the microscope, and this, too, appears on the cathode ray tube screen, presumably at a location which is closer to the original fault to be located. If the new fault was not closer, then the X and Y controls are moved so as to translate the specimen in the opposite direction. This operation is continued until the actual fault location and the artificial fault coincide as determined visually on the cathode ray tube screen or they are so close together that the inherent fault can now be seen visually. When this is achieved, the scanning operation is discontinued, and the electron microscope is operated to permit study of the faulty cell to determine the reason for its being faulty.

What is claimed is:

1. The method of physically locating and optically examining faulty cells in a semiconductor device by means of a scanning electron microscope comprising the steps of positioning a semiconductor module, including a matrix of cells, at a first viewing position in a scanning electron microscope, electrically scanning and addressing and charging each cell in the semiconductor module and displaying on an oscilloscope the scanned raster of cells and a first faulty cell therein, inducing a fault in a second cell in said module by means of the electron beam of said scanning electron microscope, electrically scanning and addressing each cell in said module and displaying said first and second faulty cells on the oscilloscope, mechanically moving said module in said microscope to a second position which tends to place the point of impingement of the electron beam of said microscope either on or closer to the location of said first faulty cell and inducing a fault in a third cell, electrically scanning and addressing each cell in the semiconductor module and displaying on an oscilloscope the scanned raster and said first and third faulty cells therein, whereby, if said first and third faulty cells coincide in position or are suitably close together as shown by the raster scan on said oscilloscope, then the operator of the microscope can visually inspect the first faulty cell to determine the reason for its being faulty.

* * * * *